(12) United States Patent
Furukawa et al.

(10) Patent No.: US 7,902,623 B2
(45) Date of Patent: Mar. 8, 2011

(54) SOLID-STATE IMAGING DEVICE

(75) Inventors: Masakazu Furukawa, Kanagawa (JP);
Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/215,242

(22) Filed: Jun. 26, 2008

(65) Prior Publication Data
US 2008/0272419 A1 Nov. 6, 2008

Related U.S. Application Data

(62) Division of application No. 11/253,823, filed on Oct. 19, 2005.

(30) Foreign Application Priority Data

Oct. 20, 2004 (JP) ................. P2004-306182

(51) Int. Cl.
*H01L 21/02* (2006.01)
(52) U.S. Cl. ......... 257/437; 257/290; 257/294; 257/436; 257/447; 257/462; 257/E27.133; 257/E31.073; 257/E31.077; 348/294
(58) Field of Classification Search .............. 257/290, 257/291, 292, 294, 431, 433, 436, 437, 447, 257/460, 461, 462, E27.133, E31.073, E31.077; 348/294
See application file for complete search history.

(56) References Cited

U.S. PATENT DOCUMENTS

| 6,166,405 A * | 12/2000 | Kuriyama et al. | 257/290 |
| 6,387,767 B1 * | 5/2002 | Besser et al. | 438/305 |
| 7,126,102 B2 * | 10/2006 | Inoue et al. | 250/214 R |
| 2004/0173906 A1 * | 9/2004 | Saito et al. | 257/758 |
| 2008/0108167 A1 * | 5/2008 | Abe et al. | 438/59 |

FOREIGN PATENT DOCUMENTS

| JP | 2003-273343 | 8/1994 |
| JP | 2000-323695 A | 11/2000 |
| JP | 06-236986 | 9/2003 |
| JP | 2003-338615 | 11/2003 |

OTHER PUBLICATIONS

Japanese Office Action issued Nov. 9, 2010 for corresponding Japanese Application No. 2004-306182.

* cited by examiner

*Primary Examiner* — A. Sefer
*Assistant Examiner* — Eduardo A Rodela
(74) *Attorney, Agent, or Firm* — Rader, Fishman & Grauer PLLC

(57) ABSTRACT

A solid-state imaging device includes a photoelectric conversion section which is provided for each pixel and which converts light incident on a first surface of a substrate into signal charges, a circuit region which reads signal charges accumulated by the photoelectric conversion section, a multilayer film including an insulating film and a wiring film, the multilayer film being disposed on a second surface of the substrate opposite to the first surface, and a transmission-preventing film disposed at least between the wiring film in the multilayer film and the substrate.

7 Claims, 11 Drawing Sheets

SOLID-STATE IMAGING DEVICE

CROSS REFERENCES TO RELATED APPLICATIONS

The subject matter of application Ser. No. 11/253,823 is incorporated herein by reference. The present application is a divisional of U.S. application Ser. No. 11/253,823, filed Oct. 19, 2005, which claims priority to Japanese Patent Application No. JP2004-306182, filed Oct. 20, 2004. The present application claims priority to these previously filed applications.

BACKGROUND OF THE INVENTION

1. Field of the Invention

The present invention relates to a backside-illumination-type solid-state imaging device in which a light-receiving surface of a photoelectric conversion section is disposed on a backside of a substrate. In particular, the invention relates to a solid-state imaging device that is suitable for use in CMOS image sensors manufactured using a MOS process.

2. Description of the Related Art

Recently, in solid-state imaging devices, such as CCD image sensors and CMOS image sensors, with the reduction in the size of devices to be mounted, the chip area has been reduced and reduction in the area per pixel has been necessitated. As a result, in a solid-state imaging device which receives light from the front side of a chip substrate, where electrodes and lines are placed, light is blocked by the electrodes and lines, and thus it is not possible to have satisfactory light collection characteristics. As a technique to overcome this problem, a backside-illumination-type solid-state imaging device is fabricated in which light is received from the backside of a substrate, where no lines or electrodes are placed, and photoelectric conversion is performed in the substrate to improve light collection characteristics. For example, refer to Japanese Unexamined Patent Application Publication No. 2003-338615 (Patent Document 1).

FIG. 1 is a cross-sectional view showing an example of a typical structure of a backside-illumination-type solid-state imaging device (CMOS image sensor) in the past.

In the solid-state imaging device, light-receiving portions 12 of photoelectric conversion sections (photodiodes) and element isolation regions 14 are disposed in a semiconductor substrate 10, and gate oxide films 16 of MOS transistors, gate electrodes 18, contacts (not shown), wiring films 22 and 26, interlayer insulating films 24 and 28, an insulation covering film 30, etc. are disposed on and above the semiconductor substrate 10.

In such a backside-illumination-type device, light is received from the backside, and light incident on the light-receiving portion 12 in the semiconductor substrate 10 is subjected to photoelectric conversion. Light received from the backside is not entirely subjected to photoelectric conversion in the substrate 10, and as indicated by an arrow A, a part of incident light reaches the front surface of the substrate 10 and is further transmitted through the upper layers above the front surface of the substrate 10. The light transmitted through the upper layers is reflected by the wiring film 26 composed of a metal located in the upper layer above the substrate 10. As indicated by an arrow B, some part of the reflected light enters the photoelectric conversion section again.

When such reflected light returns to and enters the photoelectric conversion section through which the light has been originally transmitted, substantially no adverse effect is caused. However, when the reflected light enters another photoelectric conversion section other than the original photoelectric conversion section, color separation characteristics may be degraded, and flare or the like may occur.

Under these circumstances, a technique has been proposed in which a gate electrode or a gate oxide film is allowed to function as a metal reflection film or a dielectric reflection film to prevent the adverse effect of reflected light.

SUMMARY OF THE INVENTION

It is, however, difficult to allow a gate oxide film to function as a reflection film using a MOS process. Such an approach is not disclosed in Patent Document 1 and is not feasible.

Furthermore, although it is possible to allow a gate electrode to function as a reflection film, such an approach alone is not sufficient. For example, as shown in FIG. 1, if light passes through the photodiode, light reflected by the wiring film located in the upper layer is highly likely to reenter another pixel.

There is a need for a backside-illumination-type solid-state imaging device which can prevent light that has entered from the backside of a substrate, has been transmitted through a photoelectric conversion section, and has been reflected by a wiring film from improperly reentering another photoelectric conversion section and in which a high-quality image can be obtained.

According to an embodiment of the present invention, a solid-state imaging device includes a photoelectric conversion section which is provided for each pixel and which converts light incident on a first surface of a substrate into signal charges, a circuit region which reads signal charges accumulated by the photoelectric conversion section, a multilayer film including an insulating film and a wiring film, the multilayer film being disposed on a second surface of the substrate opposite to the first surface, and a transmission-preventing film disposed at least between the wiring film in the multilayer film and the substrate.

According to another embodiment of the present invention, a solid-state imaging device includes a photoelectric conversion section which is provided for each pixel and which converts light incident on a first surface of a substrate into signal charges, a multilayer film including an insulating film and a wiring film, the multilayer film being disposed on a second surface of the substrate opposite to the first surface, and a transmission-preventing film which is disposed above the second surface of the substrate and at a position closer to the substrate than the wiring film.

DESCRIPTION OF THE PREFERRED EMBODIMENTS

According to an embodiment of the present invention, in a CMOS solid-state imaging device of a backside-illumination type, a transmission-preventing film is provided between a silicon substrate and a wiring film in the lowest layer of a multilayer film, the transmission-preventing film preventing light that has entered from the backside of the silicon substrate and has been transmitted through the silicon substrate from reaching the wiring film. Thereby, it is possible to prevent light reflected by the wiring film from improperly entering another pixel and being subjected to photoelectric conversion. Specifically, a silicide film may be used, the silicide film being formed by placing a cobalt film or the like on the surface of a silicon substrate and the surface of a polysilicon electrode film and performing heat treatment. Alternatively, a dummy metal wiring film serving as a reflection film may be provided in the lowest layer of the multilayer film, or a light-absorbing film may be used as an interlayer insulating film.

Example 1

Figure 1:
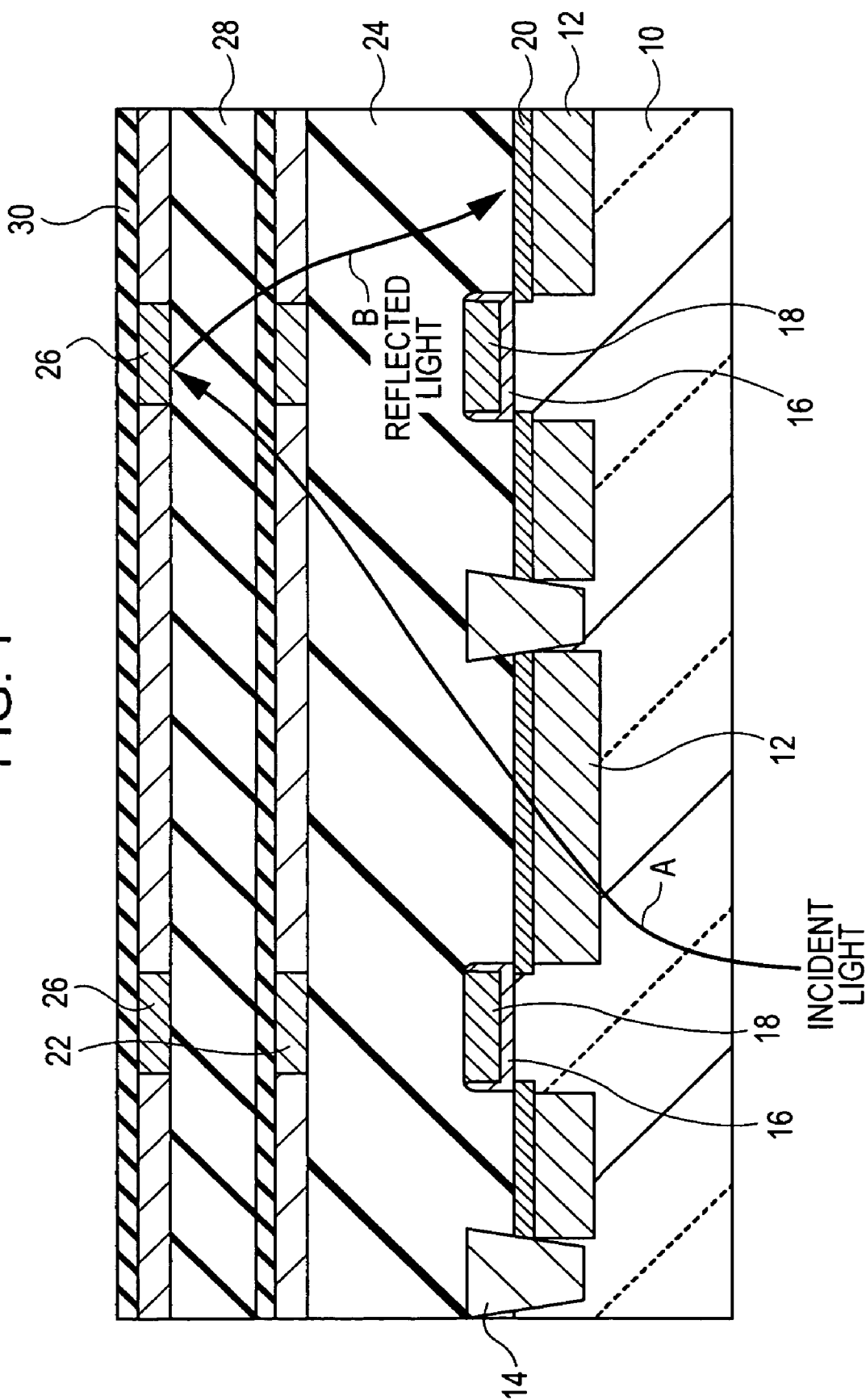
FIG. 1 is a cross-sectional view showing an example of a structure of a solid-state imaging device in the past.
Figure 2:
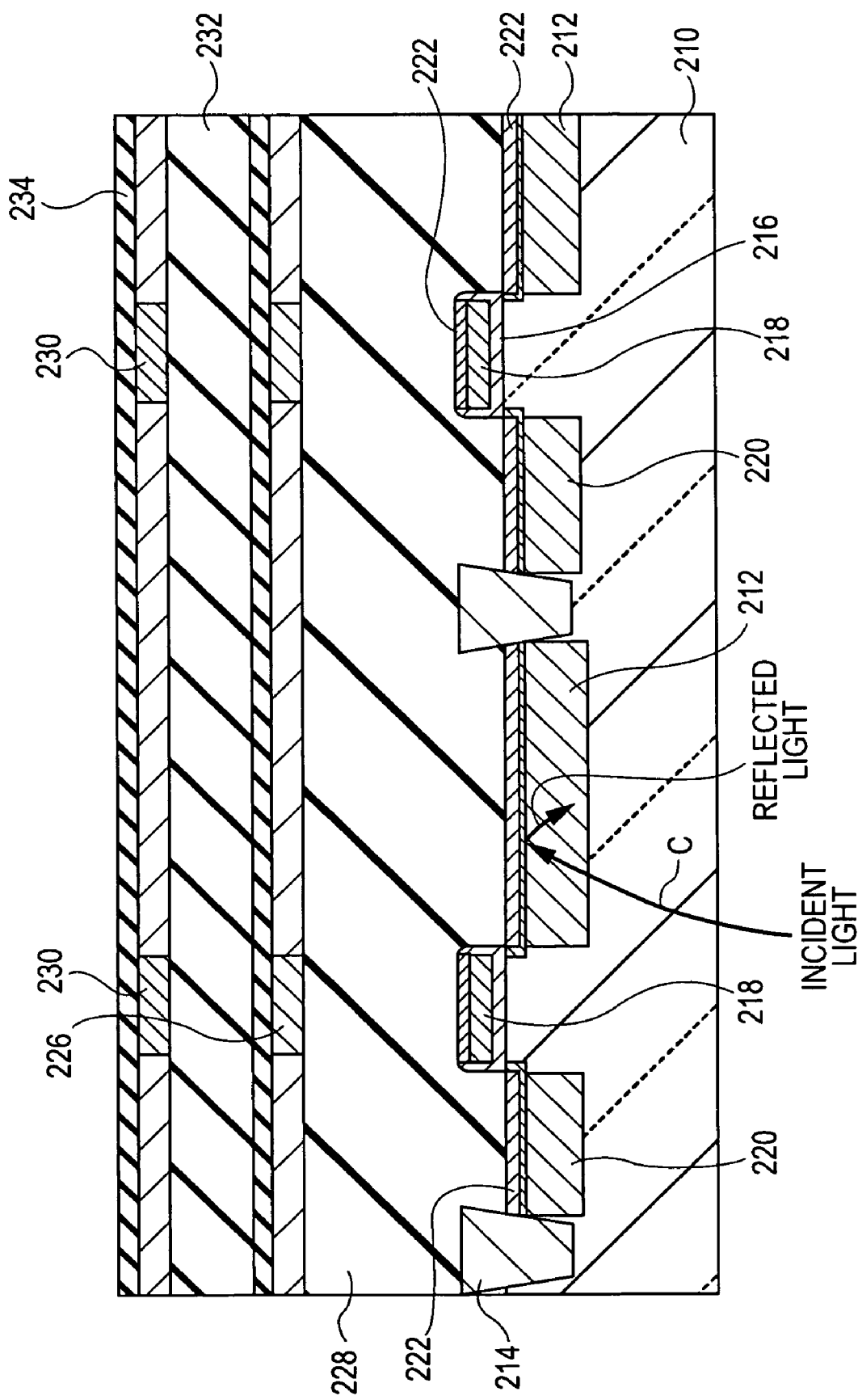
FIG. 2 is a cross-sectional view showing an example of a structure of a solid-state imaging device according to Example 1 of the present invention.
Figure 3:
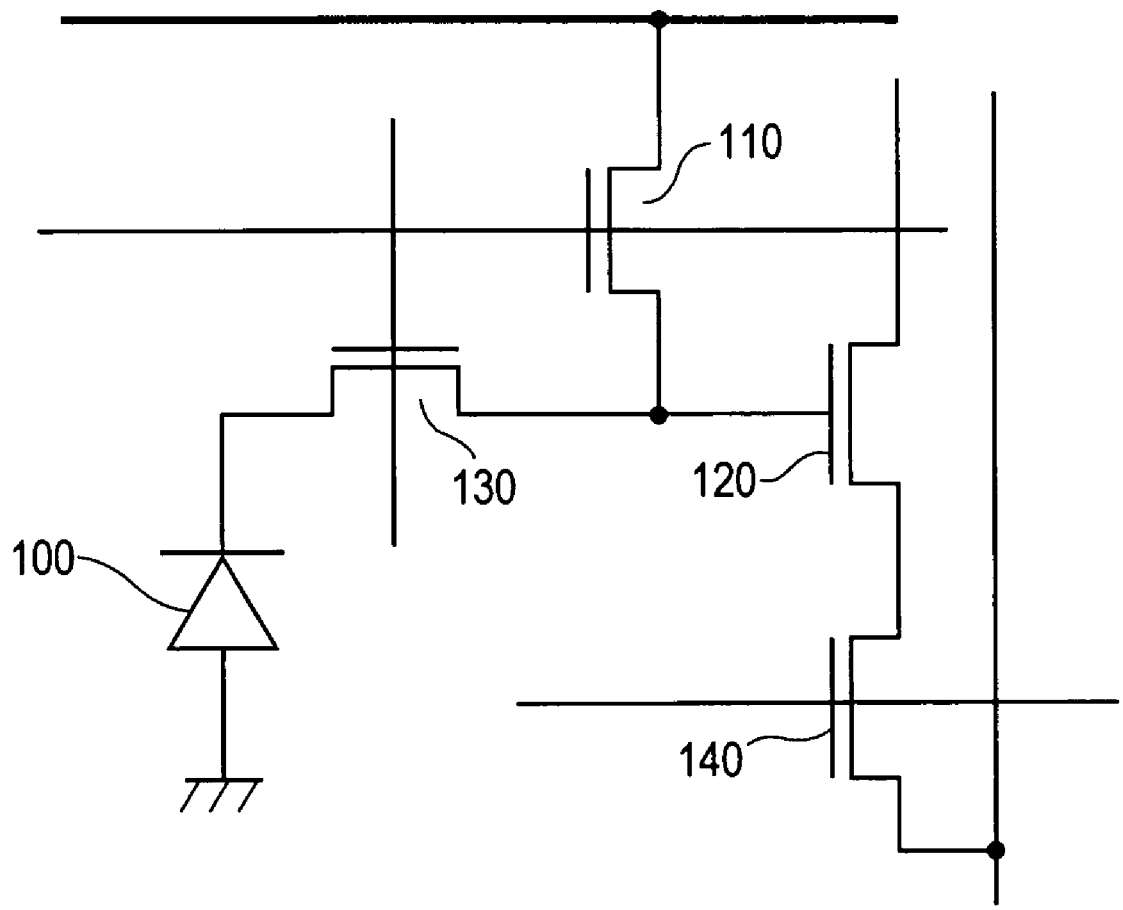
FIG. 3 is a circuit diagram showing an example of a configuration of a pixel transistor circuit in the solid-state imaging device shown in FIG. 2.

FIG. 2 is a cross-sectional view showing an example of a structure of a solid-state imaging device according to Example 1 of the present invention, and FIG. 3 is a circuit diagram showing an example of a configuration of a circuit region (pixel transistor circuit) in the solid-state imaging device shown in FIG. 2. FIGS. 4 to 12 are cross-sectional views each showing a specific example of a method for fabricating the solid-state imaging device shown in FIG. 2.

First, as shown in FIG. 3, in the solid-state imaging device according to this example, each pixel is provided with a photodiode (PD) 100 functioning as a photoelectric conversion section, a reset transistor 110 for resetting charges accumulated in the photodiode 100, an amplifier transistor 120 for amplifying and outputting pixel signals corresponding to the amount of accumulated charges, a transfer transistor 130 for selecting the timing of transfer of signal charges accumulated in the photodiode 100 to the gate of the amplifier transistor 120, and a selection transistor 140 for selecting a pixel from which signal charges are read. Additionally, such a configuration of pixel circuit may be the same as that used in the past, or another circuit configuration, for example, a configuration which does not include a transfer transistor, may be used.

Referring to FIG. 2, a photoelectric conversion section (photodiode) and the MOS transistors described above are disposed in a region isolated by an element isolation region 214 in a semiconductor substrate 210 as a base member. A light-receiving portion 212 of the photodiode receives light entering from the backside of the semiconductor substrate 210 and performs photoelectric conversion. In this example, the photodiode has a hole accumulation diode (HAD) structure in which a p-type layer functioning as a hole accumulation region is provided on a light-receiving surface of an n-type layer functioning as an electron accumulation region. A transfer transistor is disposed adjacent to the photodiode, and a gate electrode 218 is disposed on the substrate with a gate oxide film 216 therebetween. Signal charges generated in the photodiode are transferred to a floating diffusion section (drain) 220.

Furthermore, a silicide film 222 ($CoSi_2$ or the like) is formed on the upper surfaces of the gate oxide film 216 and the gate electrode 218, the silicide film 222 being produced by alloying a silicon layer with a metal, such as cobalt. Contacts (not shown), wiring films 226 and 230, interlayer insulating films 228 and 232, an insulation covering film 234, etc. are further provided thereon.

In such a solid-state imaging device, since the silicide film 222 functioning as a transmission-preventing film is disposed between the upper surface (front surface) of the semiconductor substrate 210 and the wiring films 226 and 230, light that has entered from the backside of the semiconductor substrate 210 and that is transmitted through the photoelectric conversion section is reflected by the silicide film 222 toward the photoelectric conversion section. Thus, it is possible to prevent transmission of light to the wiring films 226 and 230 and reflection of light from the wiring films 226 and 230.

A method for forming a silicide film as that shown in FIG. 2 will now be described with reference to FIGS. 4 to 12.

Figure 4:
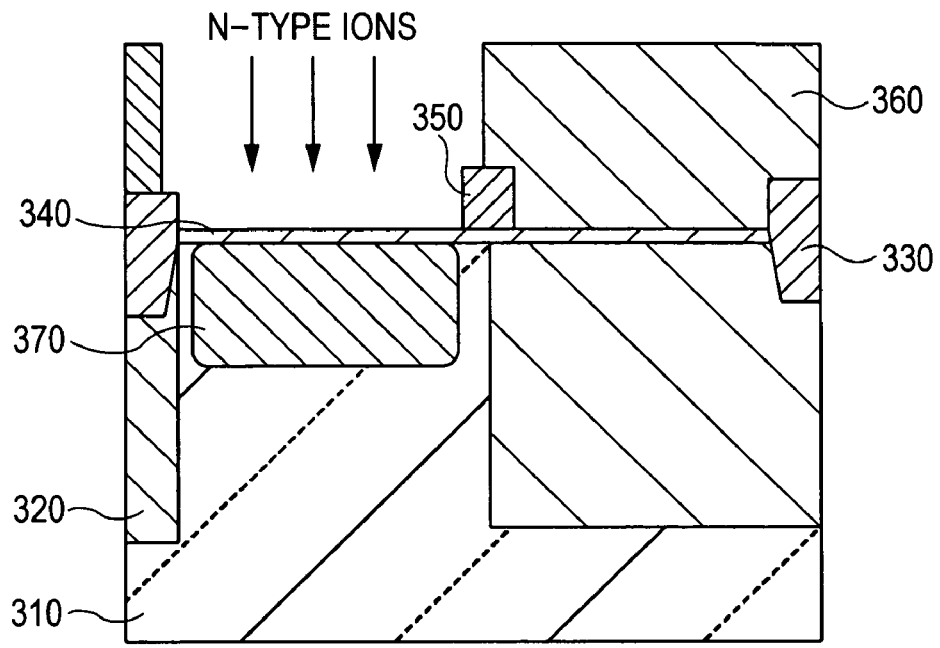
FIG. 4 is a cross-sectional view showing a specific example of a method for fabricating the solid-state imaging device shown in FIG. 2.

First, referring to FIG. 4, a p-type well layer 320 is formed in a region for forming a photodiode section and a floating diffusion (FD) section in an n-type silicon substrate 310. An element isolation region 330, a gate oxide film 340, and a gate electrode (polysilicon film) 350 are formed on the upper surface of the silicon substrate 310. Then, patterning of a photoresist layer 360 is performed, and n-type ions are implanted into the photodiode section to form an n-type layer 370 of the photodiode.

Figure 5:
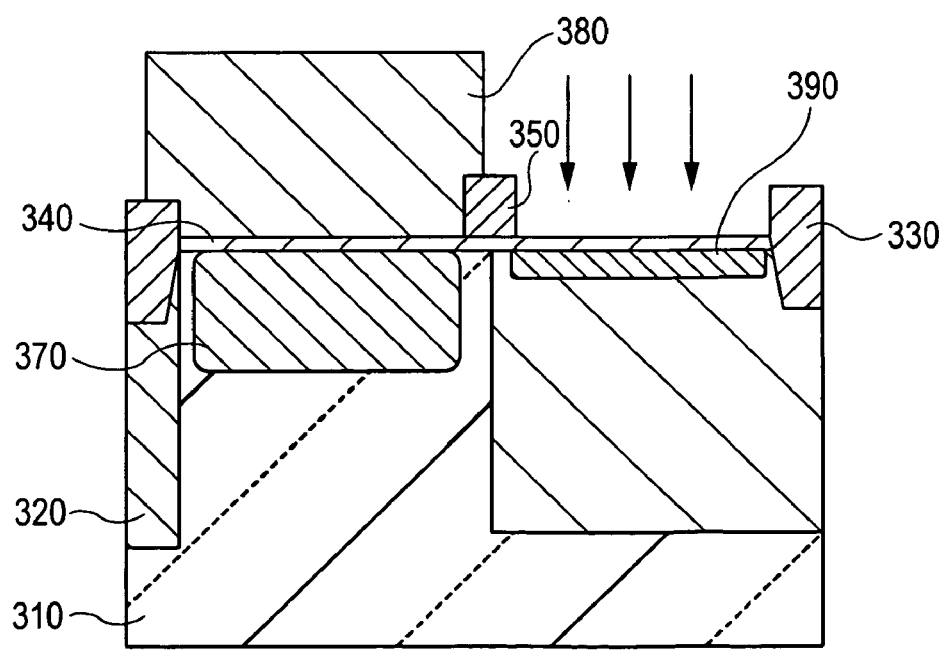
FIG. 5 is a cross-sectional view showing a specific example of a method for fabricating the solid-state imaging device shown in FIG. 2.
Figure 6:
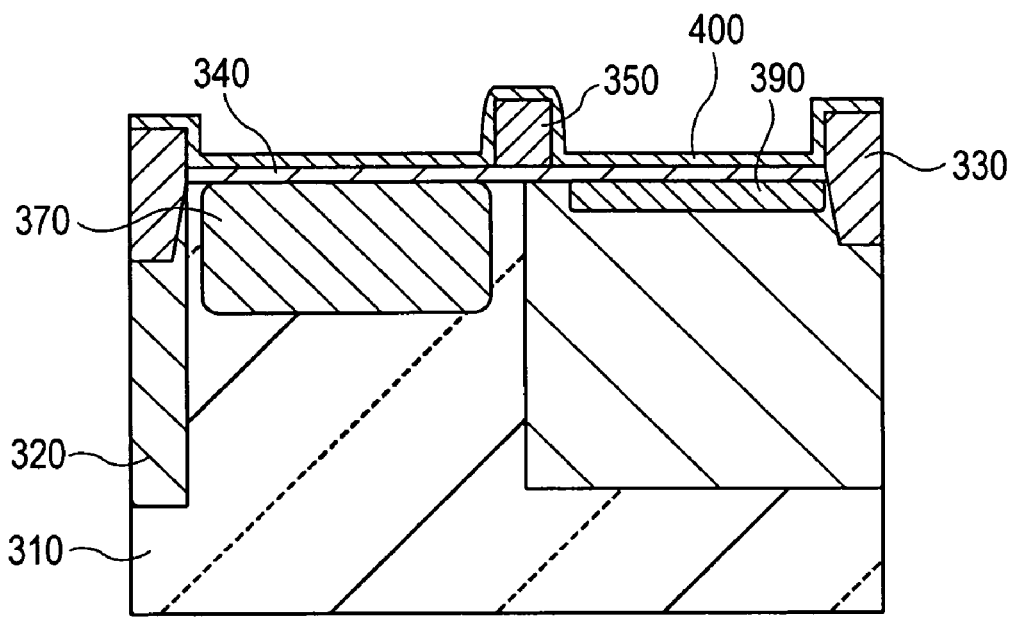
FIG. 6 is a cross-sectional view showing a specific example of a method for fabricating the solid-state imaging device shown in FIG. 2.
Figure 7:
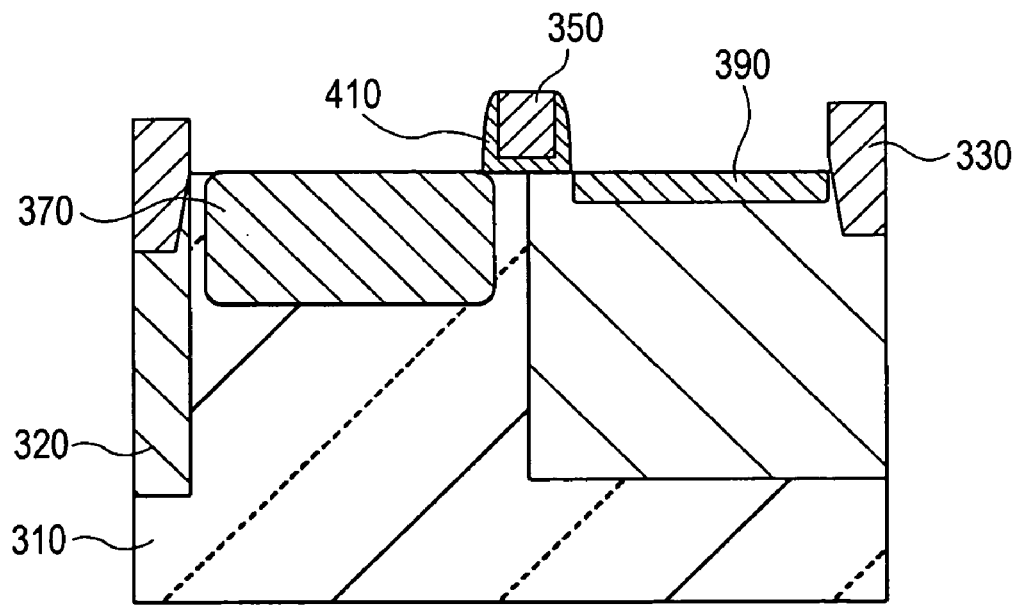
FIG. 7 is a cross-sectional view showing a specific example of a method for fabricating the solid-state imaging device shown in FIG. 2.

As shown in FIG. 5, patterning of a photoresist layer 380 is performed, and a thin n-type layer 390 is formed in the FD section by implantation of ions. Furthermore, as shown in FIG. 6, an oxide film 400 is deposited over the entire surface. Then, as shown in FIG. 7, an etch-back process is performed to form a sidewall 410.

Figure 8:
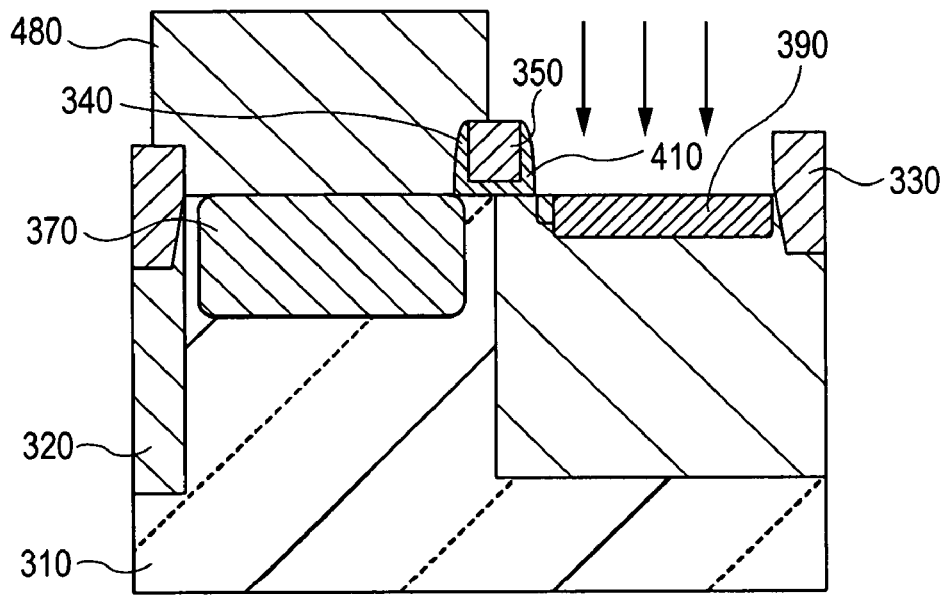
FIG. 8 is a cross-sectional view showing a specific example of a method for fabricating the solid-state imaging device shown in FIG. 2.
Figure 9:
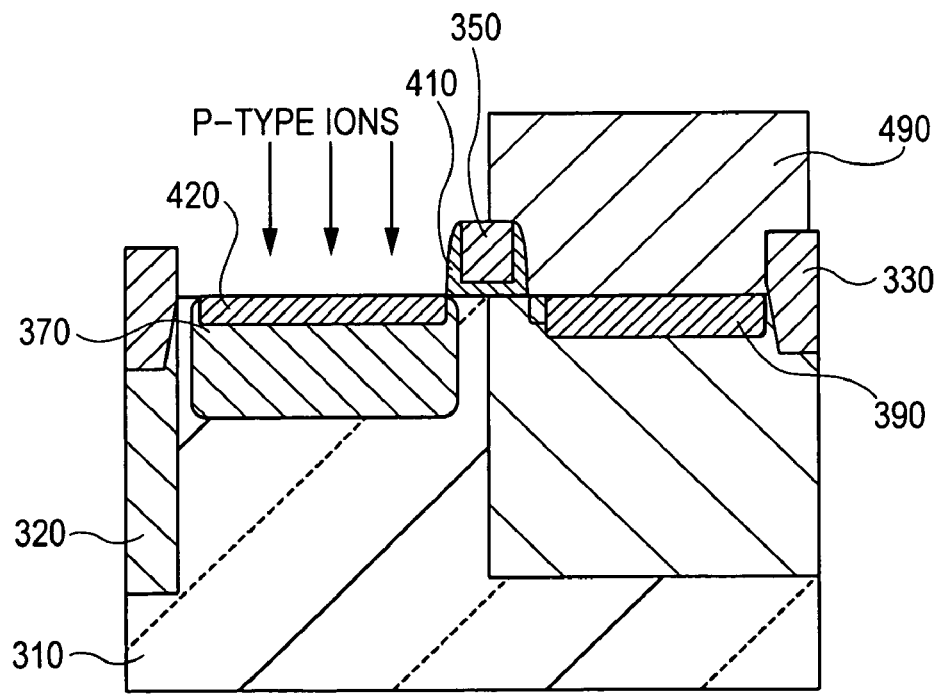
FIG. 9 is a cross-sectional view showing a specific example of a method for fabricating the solid-state imaging device shown in FIG. 2.

Subsequently, as shown in FIG. 8, patterning of a photoresist layer 480 is performed, and ions of high density are implanted into the FD section to form an LDD structure. As shown in FIG. 9, patterning of a photoresist layer 490 is performed, and p-type ions are implanted shallowly into the photodiode section. A photodiode with a HAD structure is thereby produced.

Figure 10:
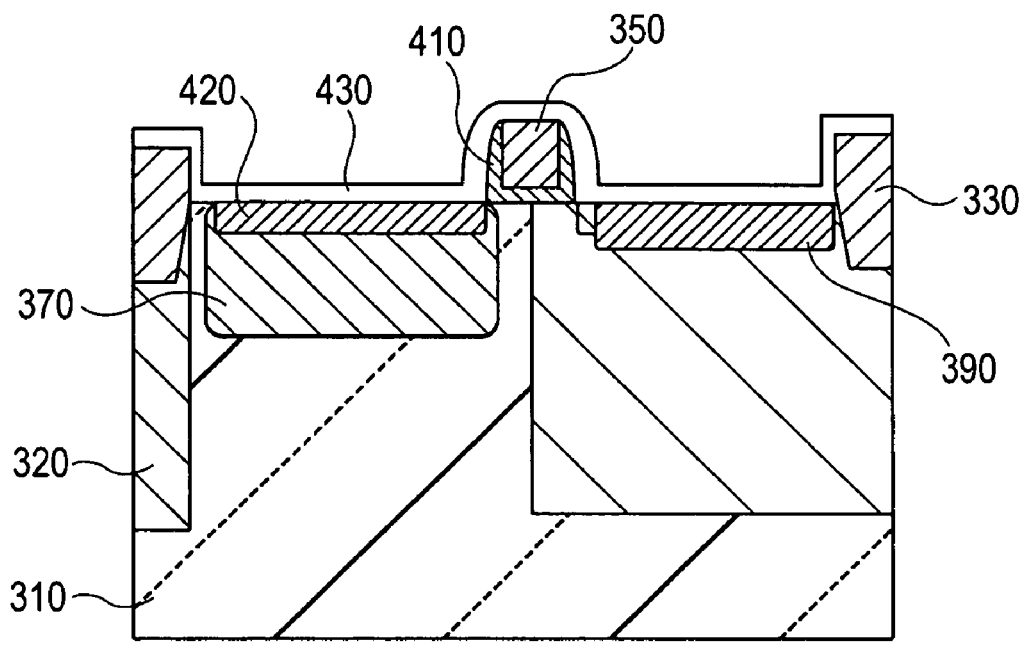
FIG. 10 is a cross-sectional view showing a specific example of a method for fabricating the solid-state imaging device shown in FIG. 2.
Figure 11:
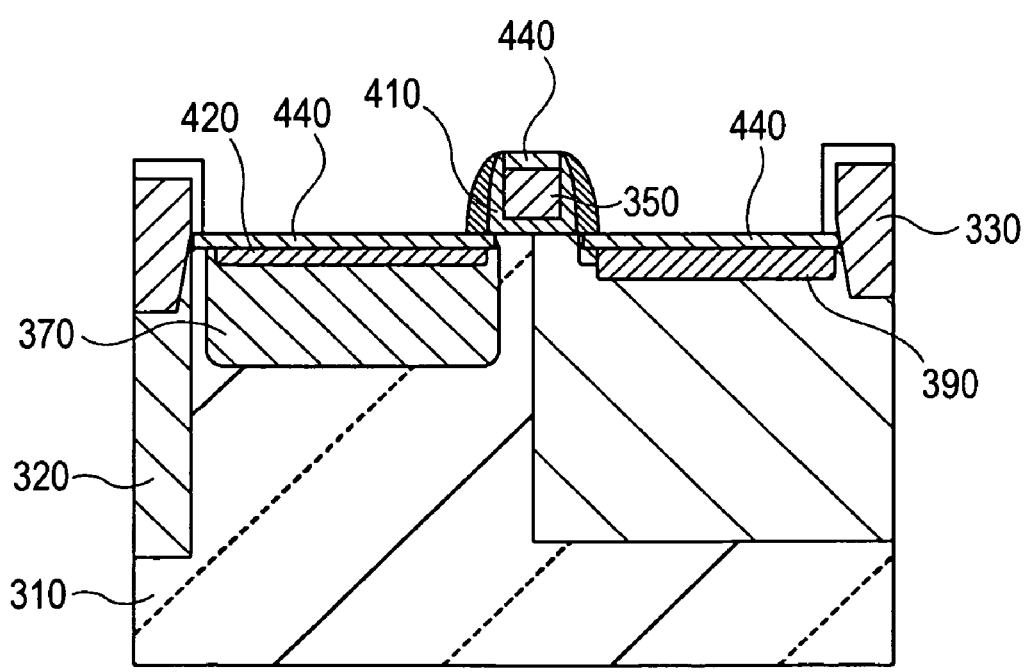
FIG. 11 is a cross-sectional view showing a specific example of a method for fabricating the solid-state imaging device shown in FIG. 2.
Figure 12:
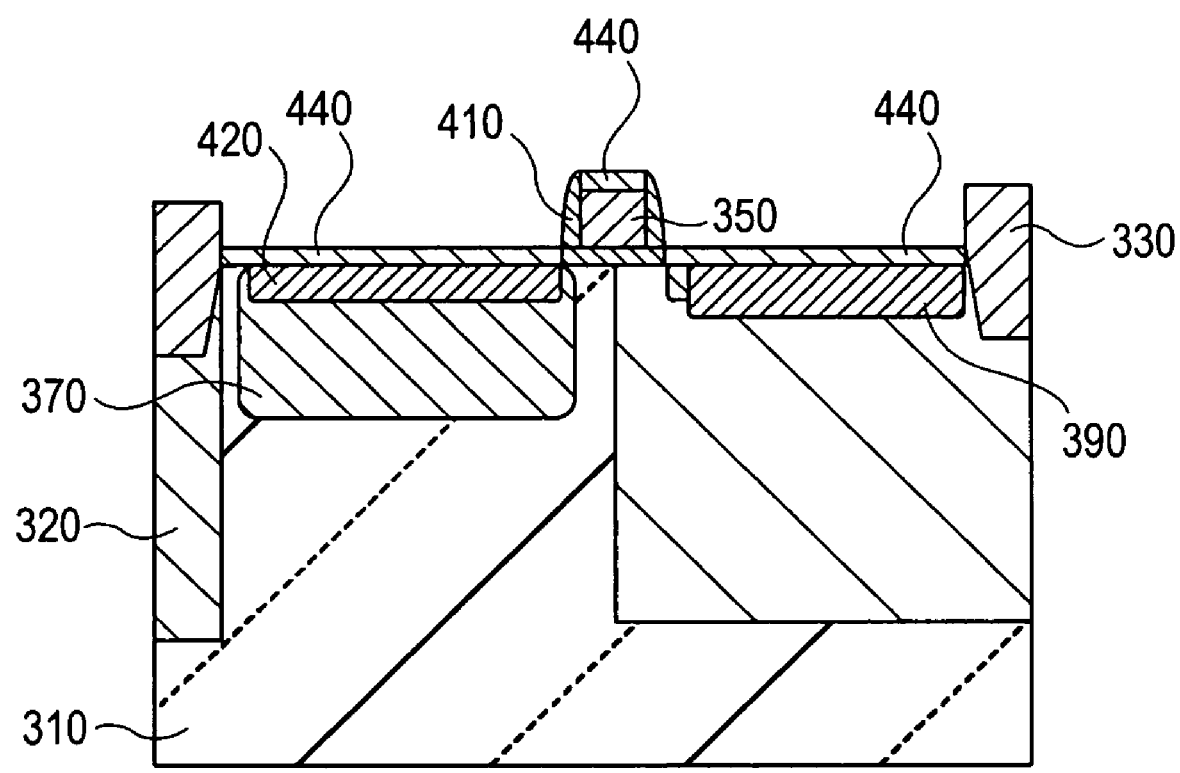
FIG. 12 is a cross-sectional view showing a specific example of a method for fabricating the solid-state imaging device shown in FIG. 2.

Next, as shown in FIG. 10, a Co film 430 is formed by sputtering over the entire surface. By subsequent annealing, as shown in FIG. 11, a $CoSi_2$ film 440 is formed at a portion in which the Co film 430 and Si of the silicon substrate 310 are in contact with each other and at a portion in which the Co film 430 and poly-Si of the gate electrode 350 are in contact with each other. Furthermore, at a portion in which the Co film 430 and $SiO_2$ of the gate oxide film 340 are in contact with each other, $CoSi_2$ is not formed. Thus, the silicide films 440 are formed in the Si and poly-Si regions. Then, as shown in FIG. 12, wet etching is performed to remove the Co film on the gate oxide layer 340. Subsequently, the same steps are carried out as those in the past to complete a solid-state imaging device, which is not directly related to the present invention. Therefore, a description thereof will be omitted.

Thus, silicide films are formed on the surfaces of the photodiode sections and the source/drain sections. As indicated by an arrow C in FIG. 2, it is possible to block light entering from the backside of the substrate. Consequently, light transmitted through the silicon substrate is not reflected by the wiring films located in the upper layers and is not subjected to photoelectric conversion in a light-receiving portion of another pixel. Thereby, it is possible to prevent degradation in color separation characteristics or occurrence of flare. Additionally, this Example 1 is merely an example, and the silicide film used in the present invention is of course not limited to the cobalt silicide film described above and may be a tungsten silicide film or the like. Furthermore, the position and the formation method of the silicide film are not limited to the example described above.

Example 2

Figure 13:
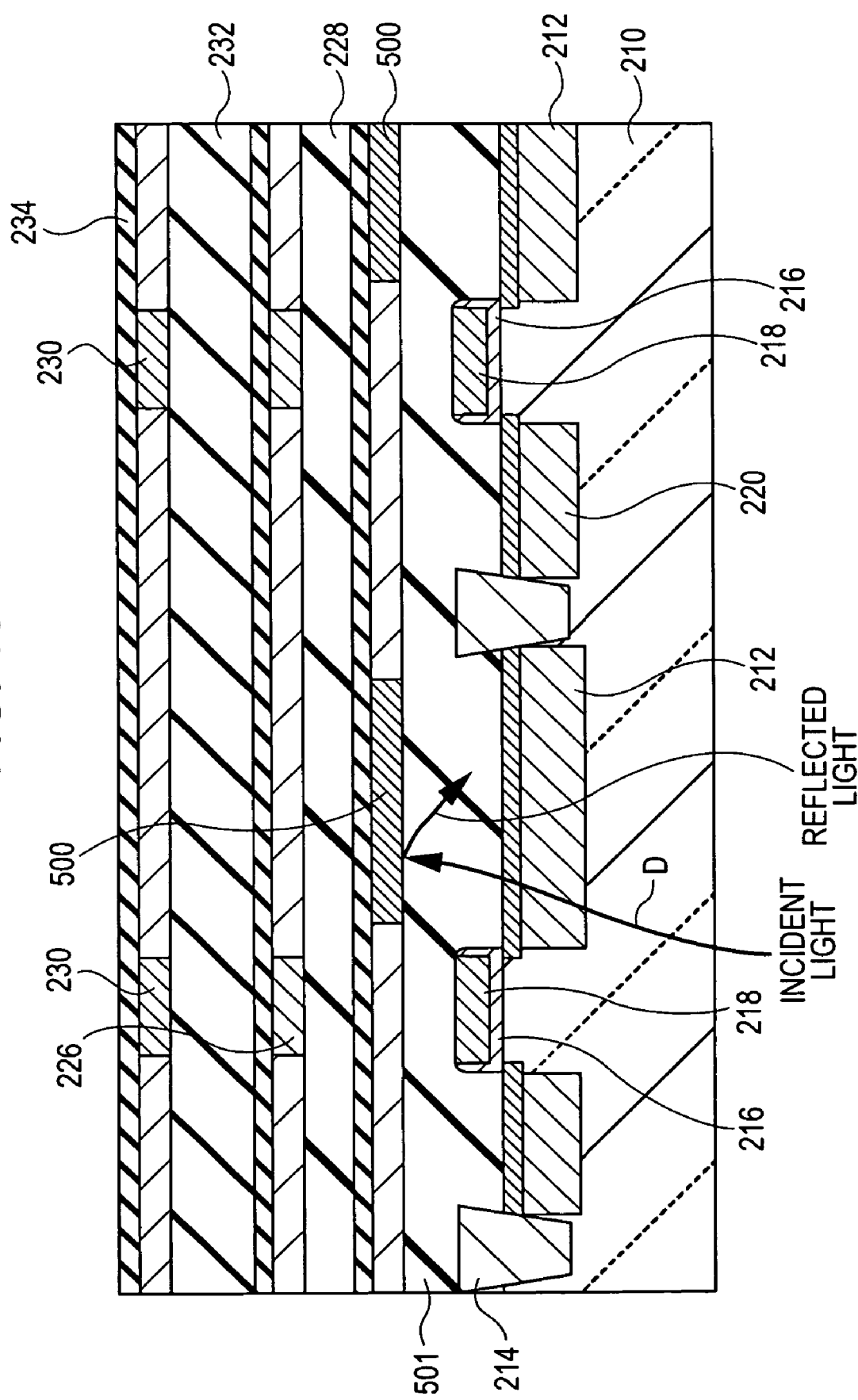
FIG. 13 is a cross-sectional view showing an example of a structure of a solid-state imaging device according to Example 2 of the present invention.

FIG. 13 is a cross-sectional view showing an example of a structure of a solid-state imaging device according to Example 2 of the present invention. The same reference numerals are used to designate the same elements as those shown in FIG. 2.

In Example 2, in place of the silicide films described above, light-shielding dummy wiring films 500 are disposed as films that prevent transmission of light.

As shown in FIG. 13, the light-shielding dummy wiring films 500 are disposed in the lowest layer under the layers in which wiring films having the original function are disposed. An interlayer insulating film 501 is disposed thereunder. The dummy wiring films 500 are not composed of a material that transmits light, such as polysilicon, but are composed of a metal, such as tungsten or aluminum, or composed of an alloy. As shown in FIG. 13, the dummy wiring films 500 are formed in a pattern corresponding to light-receiving regions of the photodiodes. In Example 2, as indicated by an arrow D, light that has entered from the backside of the substrate and has been transmitted through the substrate is reflected at the position close to the photodiode, and improper entry of light into another pixel can be prevented. Additionally, as the material for the light-shielding dummy wiring films, tungsten silicide or cobalt silicide described above may be used.

Example 3

Figure 14:
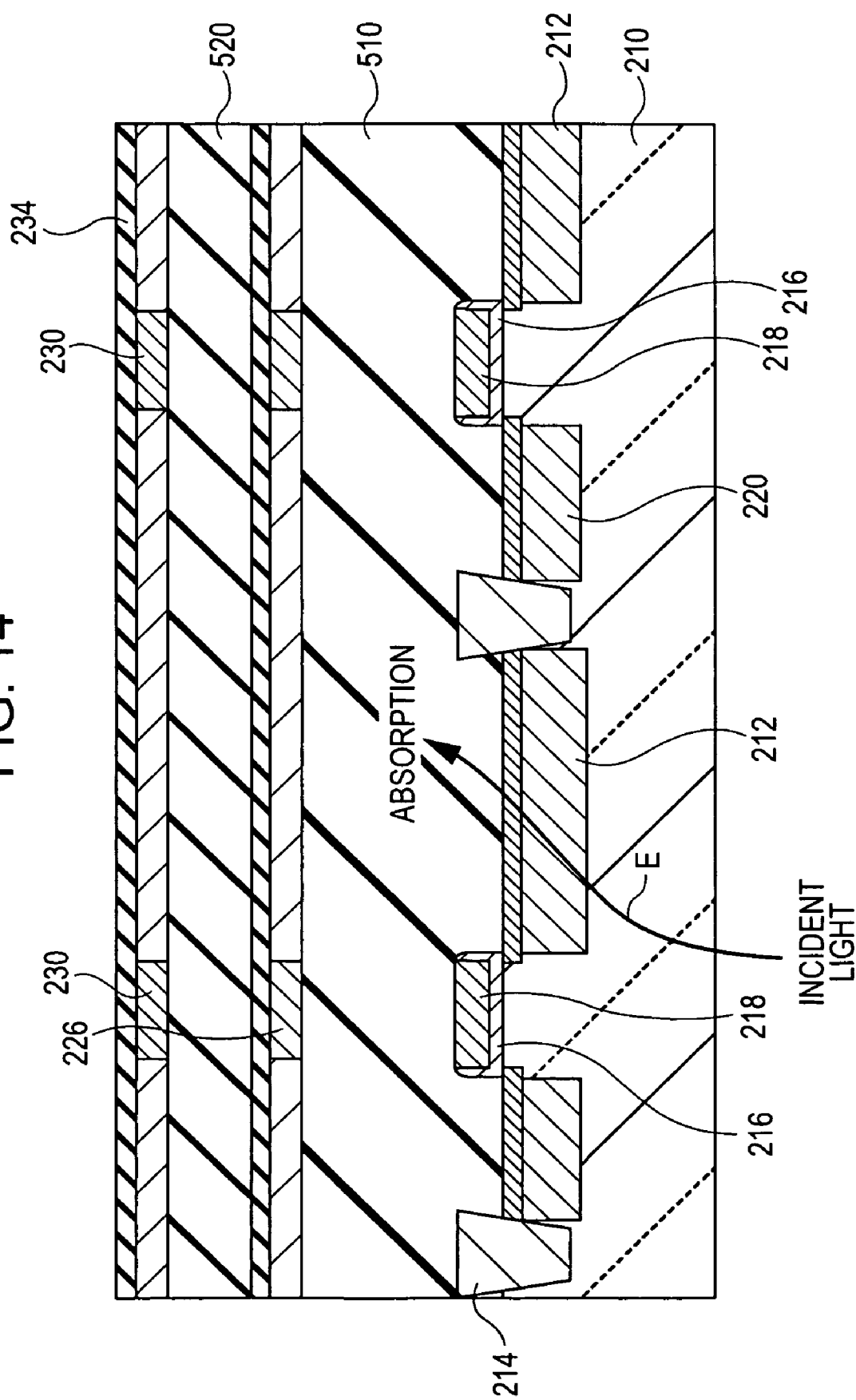
FIG. 14 is a cross-sectional view showing an example of a structure of a solid-state imaging device according to Example 3 of the present invention.

FIG. 14 is a cross-sectional view showing an example of a structure of a solid-state imaging device according to Example 3 of the present invention. The same reference numerals are used to designate the same elements as those shown in FIG. 2.

In Example 3, as films that prevent transmission of light, interlayer films having a light-absorbing property are used.

As shown in FIG. 14, interlayer insulating films 510 and 520 are disposed between the silicon substrate and a first wiring film layer and between the first wiring film layer and a second wiring film layer, respectively. These interlayer insulating films 510 and 520 serve as light-absorbing films. Specifically, for example, silicon carbide (SiC) may be used.

By providing such interlayer insulating films 510 and 520, as indicated by an arrow E in FIG. 14, even if light that has entered from the backside reaches the front side of the substrate, light is absorbed by the interlayer insulating films 510 and 520, and improper entry of light into another pixel can be prevented.

In Examples 1 to 3, the transmission-preventing film is mainly provided between the substrate and the wiring film in the lowest layer. However, it is to be understood that even when a transmission-preventing film is disposed in a layer above the wiring film in the lowest layer, a satisfactory effect can be obtained. For example, a transmission-preventing film may be provided between the lowest layer and a wiring film in the second lowest layer.

It should be understood by those skilled in the art that various modifications, combinations, sub-combinations and alterations may occur depending on design requirements and other factors insofar as they are within the scope of the appended claims or the equivalents thereof.

Figure 15:
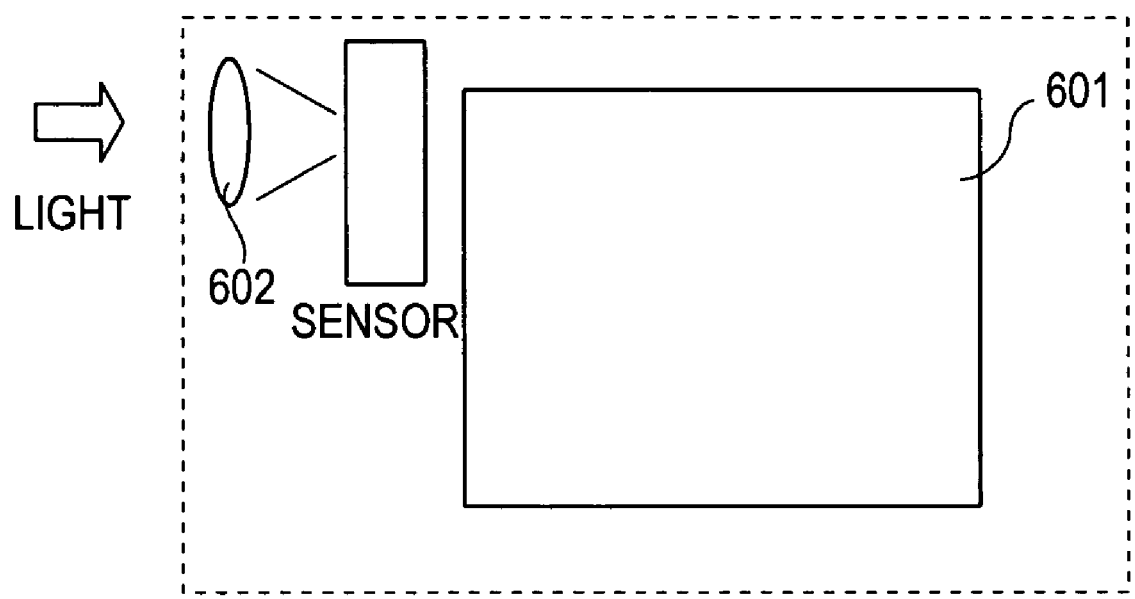
FIG. 15 is a block diagram of the present invention applied to a solid-state imaging apparatus.

Also, the present invention may be applied to a solid-state imaging apparatus, like a camera or a camera module, as is described in FIG. 15. The solid-state imaging apparatus may include a signal processing portion 601 which processes image signals based on the signal charges and an optical system 602 which conducts incident light to an imaging area. In that case, the solid-state imaging apparatus can capture a good quality image.

According to the embodiment of the present invention, in a solid-state imaging device (or apparatus) of a backside-illumination-type in which a light-receiving surface of a photoelectric conversion section is disposed on a first surface (backside) of a substrate, a transmission-preventing film which prevents the transmission of light is disposed between a wiring film located above the substrate and the substrate. Thereby, it is possible to prevent light that has entered from the backside of the substrate and has been transmitted through the substrate from being reflected by the wiring film and improperly entering a photoelectric conversion section of another pixel. Consequently, degradation of image quality can be prevented.

Furthermore, the circuit region of the solid-state imaging device may include an amplifier transistor, a selection transistor, and a reset transistor, and may further include a transfer transistor. Degradation of image quality caused by improper reflected light can be prevented without being restricted by the structure of the circuit region. Thus, the solid-state imaging device can be easily applied to various pixel structures.

Furthermore, the photoelectric conversion section may have a hole accumulation diode (HAD) structure including an n-type layer and a p-type layer. Thereby, higher image quality can be obtained.

Furthermore, the transmission-preventing film may be a silicide film. Thereby, an appropriate transmission prevention function (reflection film) can be obtained. Moreover, if the silicide film is formed by placing a metal film on a silicon substrate and a gate electrode composed of polysilicon and performing heat treatment, it is possible to easily form the transmission-preventing film in optimal regions.

Furthermore, the transmission-preventing film may be a light-shielding metal film or alloy film. Thereby, an appropriate transmission prevention function (reflection film) can be obtained. Moreover, if the light-shielding metal film or alloy film is formed in a pattern corresponding to light-receiving regions of the photoelectric conversion sections, the metal film or alloy film can be disposed only in necessary regions, and thus transmission of light can be effectively prevented.

Furthermore, the transmission-preventing film may be an interlayer film that absorbs light. Thereby, an appropriate transmission prevention function (light absorption function) can be obtained, and degradation of image quality caused by improper reflection can be prevented.

What is claimed is:

1. A solid-state imaging device comprising:
a photoelectric conversion section which is provided for each pixel and which converts light incident thereon into a signal;
a circuit region which transfers the signal from the photoelectric conversion section;
a multilayer film including an insulating film and a wiring film, the multilayer film being disposed beneath the photoelectric conversion section; and
wherein there are a plurality of multilayer films and each multilayer film includes a layer of light absorbing material as the insulating film, wherein the layer of light absorbing material is located at a side of the photoelectric conversion section opposite a side at which light is primarily incident thereon, the light absorbing material absorbing a greater amount of light than silicon dioxide, wherein a gate electrode made of a polysilicon film with a gate insulating film between the polysilicon film and a silicon substrate, and a silicon carbide layer is formed adjacent the silicon substrate and the polysilicon film as the layer of light absorbing material.

2. The solid-state imaging device according to claim 1, wherein the circuit region includes
an amplifier transistor for amplifying and outputting pixel signals corresponding to the amount of accumulated charges in the photoelectric conversion section,
a selection transistor for selecting a pixel from which signal charges are read, and
a reset transistor for resetting charges accumulated in the photoelectric conversion section.

3. The solid-state imaging device according to claim 2, wherein the circuit region further includes a transfer transistor for selecting the timing of transfer of signal charges accumulated in the photoelectric conversion section to the amplifier transistor.

4. The solid-state imaging device according to claim 1, wherein the photoelectric conversion section includes
an n-type layer which accumulates electrons serving as signal charges, and
a p-type layer which is provided in a surface region of the n-type layer and which accumulates holes.

5. The solid-state imaging device according to claim 1, wherein the transmission-preventing film is an interlayer film that absorbs light.

6. A solid-state imaging device comprising:
a photoelectric conversion section which is provided for each pixel and which converts light incident into a signal;
a multilayer film including an insulating film and wirings, the multilayer film being disposed beneath the photoelectric conversion section; and
wherein there are a plurality of multilayer films and each multilayer film includes a layer of light absorbing material as the insulating film, wherein the layer of light absorbing material is located at a side of the photoelectric conversion section opposite a side at which light is primarily incident thereon, the light absorbing material absorbing a greater amount of light than silicon dioxide, wherein the light absorbing material is silicon carbide.

7. A solid-state imaging apparatus comprising:
a photoelectric conversion section which is provided for each pixel and which converts light incident thereon into a signal;
a multilayer film including an insulating film and a wiring, the multilayer film being disposed beneath the photoelectric conversion section;
wherein there are a plurality of multilayer films and each multilayer film includes a layer of light absorbing material as the insulating film, the light absorbing material absorbing a greater amount of light than silicon dioxide; and
a signal processing portion which processes image signals based on the signals generated by the photoelectric conversion section, wherein the layer of light absorbing material is located at a side of the photoelectric conversion section opposite a side at which light is primarily incident thereon, wherein the light absorbing material is silicon carbide.

* * * * *